United States Patent
Hoffmeister et al.

(10) Patent No.: US 11,146,221 B2
(45) Date of Patent: Oct. 12, 2021

(54) METHOD FOR OVERTEMPERATURE PROTECTION AND AUDIO APPARATUS

(71) Applicant: Robert Bosch GmbH, Stuttgart (DE)

(72) Inventors: Fabian Hoffmeister, Schoenau (DE); Gregor Sauer, Straubing (DE); Josef Plager, Bogen (DE); Patrick Engl, Rattiszell (DE); Thomas Stein, Wald (DE)

(73) Assignee: Robert Bosch GmbH, Stuttgart (DE)

( * ) Notice: Subject to any disclaimer, the term of this patent is extended or adjusted under 35 U.S.C. 154(b) by 57 days.

(21) Appl. No.: 16/617,030

(22) PCT Filed: Apr. 11, 2018

(86) PCT No.: PCT/EP2018/059281
§ 371 (c)(1),
(2) Date: Nov. 26, 2019

(87) PCT Pub. No.: WO2018/219542
PCT Pub. Date: Dec. 6, 2018

(65) Prior Publication Data
US 2020/0091873 A1 Mar. 19, 2020

(30) Foreign Application Priority Data
May 30, 2017 (DE) .................... 10 2017 209 072.3

(51) Int. Cl.
*H03F 1/52* (2006.01)
*H03F 3/181* (2006.01)
(Continued)

(52) U.S. Cl.
CPC ............ *H03F 1/523* (2013.01); *H03F 3/181* (2013.01); *H03G 7/002* (2013.01); *H04R 3/007* (2013.01);
(Continued)

(58) Field of Classification Search
CPC ...... H03F 1/523; H03F 3/181; H03F 2200/03; H03F 2200/447; H03F 2200/468;
(Continued)

(56) References Cited

U.S. PATENT DOCUMENTS 6,014,059 A 1/2000 Nordwall
9,794,687 B2 * 10/2017 Napoli ................... H03G 7/002
(Continued)

FOREIGN PATENT DOCUMENTS

EP 0135870 4/1985
WO 2016124896 8/2016

OTHER PUBLICATIONS

International Search Report for Application No. PCT/EP2018/059281 dated Jul. 27, 2018 (English Translation, 3 pages).

*Primary Examiner* — Hieu P Nguyen
(74) *Attorney, Agent, or Firm* — Michael Best & Friedrich LLP

(57) ABSTRACT

The invention relates to a method for protecting a component (6) within an audio device (4) from the exceedance of a maximum internal temperature (TI), wherein a power loss (V) of the component (6) is determined, a measurement temperature (TM) is measured on the component (6), a temperature difference (DT) for the component (6) between the measurement temperature (TM) on the component and the internal temperature (TI) is determined from the power loss (V) by means of a thermal model (14) of the component (6), the internal temperature (TI) is determined as the sum of the measurement temperature (TM) and the temperature difference (DT), a permissible maximum value (VM) for the power loss (V) is determined on the basis of the internal temperature (TM) and known component data (16) of the component (6), and the component (6) is operated in a normal operating mode (N) if the power loss (V) does not exceed the maximum value (VM) or the component (6) is (Continued)

otherwise operated in reduced-power economy operating mode (S) such that the power loss (V) is limited to the maximum value (VM). An audio apparatus (2), having an audio device (4) that internally contains a component (6) that should be protected from the exceedance of a maximum internal temperature (TI), contains a protection module (8) for carrying out the method according to the invention.

14 Claims, 2 Drawing Sheets

(51) Int. Cl.
  *H03G 7/00* (2006.01)
  *H04R 3/00* (2006.01)
(52) U.S. Cl.
  CPC .... *H03F 2200/03* (2013.01); *H03F 2200/447* (2013.01); *H03F 2200/468* (2013.01)
(58) Field of Classification Search
  CPC . H03F 1/52; H03G 7/002; H03G 7/08; H04R 3/007
  USPC ...................................... 330/289, 298, 207 P
  See application file for complete search history.

(56) References Cited

U.S. PATENT DOCUMENTS

| 10,701,484 B2* | 6/2020 | Thormundsson ....... G10L 19/00 |
| 2016/0119714 A1* | 4/2016 | Madsen ................. H04R 3/007 381/55 |
| 2017/0094408 A1 | 3/2017 | Napoli et al. |

* cited by examiner

METHOD FOR OVERTEMPERATURE PROTECTION AND AUDIO APPARATUS

BACKGROUND OF THE INVENTION

In order to be able to ensure reliability in electronic devices and circuits, e.g. in audio appliances, all components used inside the audio appliance, e.g. semiconductors, need to be operated within what is known as the safe operating area (SOA). Essentially, the SOA describes the amount of power loss that can be asked of the component, e.g. the subassembly, without it being damaged. Outside this area, the component, e.g. the semiconductor, is overloaded, which would lead to its destruction.

EP 0 135 870 A1 discloses a method for overload protection for electrical loads in which the load current and the temperature of the coolant acting on the load is periodically measured and the values of current and temperature that are measured after each period are supplied to a circuit arrangement in which they are processed according to the algorithm of a thermal system to model a temperature and the modeled temperature is compared with a prescribed limit temperature above which a switch is operated to interrupt the load current. The load has at least one associated thermal system having in each case at least two system bodies. The losses from the system bodies of the thermal system are periodically ascertained. From the losses ascertained in this way, the periodically assigned value of the coolant temperature and the thermal capacities and thermal conductances of the system bodies of the thermal system, the temperature of each system body of the thermal system is ascertained and the temperature ascertained in this way for each system body to be protected in the thermal system is continuously compared with the limit temperature associated with this system body.

SUMMARY OF THE INVENTION

The invention discloses a method. Preferred or advantageous embodiments of the invention and of other categories of invention are obtained from the description below and the appended figures.

The method is used for protecting a component. The component is inside an audio appliance. The component is protected against an internal temperature inside the component exceeding a maximum internal temperature or a maximum value. The internal temperature in this case is not open to an in particular direct measurement, since it is e.g. a junction temperature inside a semiconductor as the component.

The method involves the power loss of the component being ascertained. Furthermore, a measured temperature is measured at the component. "At the component" means at a measurement location on the component or in the surroundings thereof at which measurements can be taken and that is thermally coupled to the internal temperature, that is to say from which the internal temperature can be inferred. A measurement location is in particular an electrical connection of the component, a heat sink to which the component is thermally coupled, a housing portion of the component, etc.

From the power loss, a temperature difference for the component is ascertained. The temperature difference exists between the measured temperature at the component and the internal temperature inside the component. The temperature difference is ascertained using a thermal model of the component. The internal temperature is then ascertained as the sum of the measured temperature and the temperature difference.

The internal temperature and known component data of the component are used to ascertain a permissible maximum value for the power loss. This maximum value of the power loss is known, that is to say on the basis of the known component data or the component behavior, to result in the maximum permissible or desired internal temperature being reached (the internal temperature reaches its maximum value) at which in particular the component can still be operated without risk of destruction.

According to the method, in particular the output power is reduced such that the (temperature-dependent) maximum value of the power loss is never exceeded.

In particular, the component is operated in a normal mode if the power loss does not exceed the maximum value. Alternatively, that is to say if the power loss were to exceed the maximum value, the component is operated in a reduced-power economy mode. The economy mode takes place at such reduced power that the power loss is limited to the maximum value.

In particular in the case of a semiconductor, the maximum permissible power loss is dependent on the internal junction temperature. The ascertained junction temperature can therefore be used to ascertain the maximum permissible power loss of the component to be protected at any time. The method presented here is used in the event of a threat of overload for the component to be protected to reduce the audio signal, in particular the output signal of the audio appliance, and hence the output power such that the maximum permissible power loss of the component is not exceeded.

At the ascertained maximum power loss, the maximum internal temperature inside the component is thus just reached, but not exceeded. According to the method, the power loss is thus limited only if it exceeds the permissible maximum value, which would lead to an increase in the internal temperature above the maximum permissible value of the internal temperature. In particular, the power of the component is thus lowered in the economy mode in comparison with a regular normal mode, as a result of which the power loss of said component also falls. If the maximum value is not exceeded, the component is operated without limitation.

The component data are known in particular from for example a data sheet of the component. The "maximum value" of the power loss can be the physically permissible value that, when exceeded, results in the threat of immediate destruction of the subassembly. The maximum value can alternatively be a lower desired maximum value if the maximum physically permissible internal temperature in the component is not supposed to be used up fully, but rather e.g. is only meant to be 80, 90 or 95% of this temperature or for example is meant to be kept 10, 15 or 20 degrees below this temperature. There thus remains a certain safety margin in order to protect the component against destruction.

According to the method, an albeit limited (economy) mode of the component and hence of the audio appliance thus continues to take place even if the internal temperature reaches or approaches its maximum value during a regular normal mode; all that takes place is power limiting for the power loss in the component and hence for example also for an output power of the component or of the audio appliance. The audio appliance continues to operate, however, and does not need to be shut down completely.

According to the invention, an audio appliance in the form of an amplifier delivers e.g. fully output power (normal mode) for e.g. 4 min, and then the maximum output power is limited (economy mode). In this case, e.g. a reduction by 3 dB is perceptible, but not too obvious, this signifying a halving of the output power, as a result of which the load on the power electronics is distinctly lessened. The basic function is thus maintained, in contrast to shut down.

In a preferred embodiment, the power loss is ascertained by virtue of the output power of the component being ascertained and the power loss being ascertained on the basis of the output power and the known component data. The output power is normally more easily determinable than the power loss, for example on the basis of output voltage and/or output current of a component. The component data used for this are for example subassembly properties or operating voltages at the component. It is thus possible for the power loss to be ascertained indirectly, but on the basis of the link to the component data. Alternatively, it is also possible for an input power or another variable to be ascertained, from which the (internal) power loss of the component can be inferred on the basis of the known component data.

In a preferred embodiment, the power loss is also ascertained on the basis of the internal temperature and/or the measured temperature. Both temperatures can have an influence on the power loss in the component. Taking into consideration the applicable temperatures therefore leads to more accurate ascertainment of the power loss and hence more accurate tuning of the normal and economy modes to the power limit, provided for on the basis of the maximum value, for the power loss.

In a preferred embodiment, at least one thermal time constant is used in the thermal model. The time constant describes a dynamic thermal behavior of a thermal section. The thermal section exists between the location of the internal temperature (where it occurs or is present) and the measurement location for the measured temperature (at which the measured temperature is measured). A thermal model of this kind allows the internal temperature to be inferred from the measured temperature particularly safely and reliably.

In a preferred embodiment, a maximum value for a permissible output power of the component is ascertained from the maximum value for the permissible power loss. This takes place, in line with the above, on the basis of the component data. In the reduced-power economy mode, the component is operated such that the output power is limited to the associated maximum value (for the output power). The output power of the component is normally controllable better, or directly, than the power loss. By way of example, the output power at the component is determined by a current and/or a voltage at the component. This current and voltage can be e.g. influenced or controlled in a simple manner. As such, the method is particularly easily performable.

In a preferred embodiment, in the economy mode the power loss is limited to the maximum value using an audio limiter. In this case, the audio limiter is arranged in an audio path upstream of the component. The audio path carries an audio signal and supplies (at least a signal element thereof) to the component as an input signal. The limiting takes place by virtue of the audio signal being limited as an input signal in comparison with its characteristic in the normal mode. Audio limiters are in particular easy to realize and available on the market. The use of the audio limiter allows the method to be performed particularly easily. As a result of the audio signal being limited, in particular the "volume" or amplitude thereof is lowered, and the component, e.g. an output state amplifier, then needs less power to process the audio signal and thus also produces less power loss.

The invention also discloses an audio. Said audio device contains an audio appliance. The audio appliance contains a component. The component needs—as explained above—to be protected against the exceeding of a maximum internal temperature inside the component. The audio device contains a protection module. The protection module is used to carry out the method according to the invention and is configured for this purpose. The audio device and at least some of the embodiments thereof and also the respective advantages have already been explained mutatis mutandis in connection with the method according to the invention. The audio appliance thus has an associated protection module in order to protect the component according to the method explained above. In other words, the audio device is an audio appliance modified with the protection module. The protection module is configured to carry out the method that follows:

ascertaining a power loss of the component,
measuring a measured temperature at the component,
ascertaining an internal temperature using a thermal model of the component from the ascertained power loss and the measured temperature that is measured,
ascertaining a permissible maximum value for the power loss on the basis of the internal temperature and known component data of the component,
limiting an audio signal such that the power loss does not exceed a maximum value and/or the maximum internal temperature is not exceeded.

In a preferred embodiment, the audio appliance and/or the audio device is an audio amplifier for amplifying the audio signal cited above. The audio amplifier is in particular an output stage. Audio amplifiers are normally particularly susceptible to destruction of contained components as a result of internal overtemperatures. The present method and the protection module protect them particularly effectively.

In a preferred embodiment, the component contains a semiconductor subassembly to be protected or is a semiconductor subassembly to be protected. The internal temperature is then a junction temperature in the semiconductor subassembly. In particular semiconductor subassemblies have a particularly temperature-sensitive junction. The present method and protection module protect them against destruction particularly effectively.

Alternatively, however, the component can also contain or be: a capacitor, an inductance, a relay, a resistor, a motor. The component can also be an assembly comprising multiple individual subassemblies, however. The individual subassemblies are then e.g. again the cited semiconductors, capacitors, inductances, etc. These components can also be particularly sensitive to power loss or temperatures and are protected by the present method and protection module particularly effectively.

In a preferred embodiment, the protection module contains an audio limiter as has been described above. The audio limiter is arranged in an audio path upstream of the audio appliance. The audio path carries an audio signal and supplies it to the audio appliance and hence also to the component as an input signal. The audio limiter is configured to limit the audio input signal into the audio appliance in the economy mode. The audio limiter is therefore also arranged upstream of the component in the audio path, as a result of which the aforementioned advantages are obtained.

The invention is based on insights, observations and considerations that follow and also has the embodiments below. The embodiments are sometimes also called "the invention" in this case for simplicity. The embodiments can also contain or correspond to parts or combinations of the aforementioned embodiments in this case and/or can possibly also include embodiments not mentioned hitherto.

The invention is based on the following considerations: the operation of a component within the SOA can be safeguarded in different ways: e.g. some of the semiconductors (as components) used in a device have operation within the SOA safeguarded by the design itself, and a user has no or hardly any influence on the stress on the semiconductor. Particularly in power electronics, however, it is often the case that the loading of individual semiconductors varies greatly depending on the mode of operation. If the user has a great influence on the stress on these individual components, it is necessary for specific precautions to be taken in order to protect these components. Designing the components for the worst possible case (e.g. short circuit by the user) is often tantamount to complete overdimensioning for the normal mode in this case. Although emergency shutdown of the device can protect the components in most cases, it is for the most part not preferable from the point of view of the user.

It is thus a fundamental concept of the invention to detect a threat of overload and to react by reducing the output power (or the power loss) in order thereby to limit the temperature increase. One concept is to implement the detection of a threat of overload by means of measurement of the output voltage and the output current of the component and/or using a temperature sensor placed at a measurement location close to the component to be protected or the subassembly to be protected, e.g. on the same heat sink. It is thus not the temperature of the component (semiconductor) itself that is measured, but rather a temperature that has as good a level of thermal coupling to the component temperature (semiconductor temperature) as possible. In the case of static loading, the temperature difference in this case is for the most part quite small. If heavy loading (or a potential overload) suddenly occurs, however, then a certain time elapses before the measurement location (e.g. heat sink) is heated. In this time, the temperature difference between the measured temperature and the actual component temperature (semiconductor temperature) can be very high. So as thus to be able to protect the component (semiconductor) safely against destruction exclusively on the basis of the measured temperature, it is necessary for a considerable margin to be allowed for in order to be able to protect these dynamic loadings. On the other hand, however, this also means that the static maximum power is distinctly below the possible output power.

The invention is based on the insight that the power loss of a component, e.g. of a subassembly, is determined by internal properties of the component and by external operating conditions such as voltage and current at the component. The component or subassembly properties are known. They should be specified completely in the data sheet. If the external operating conditions of the component are also known, the instantaneous power loss of the component, e.g. of the semiconductor, can be calculated. For example the operating voltage may be known and constant, and the current is variable, but is measured. If the power loss of the component or subassembly to be protected is known, then a thermal model can be used to calculate the present temperature in the component, e.g. in the semiconductor. If the thermal model (e.g. Foster model) is used to model the section between the component or semiconductor interior and the measurement location for the temperature measurement (e.g. temperature sensor), then the calculated heating can be added to the measured temperature. In this way, the internal temperature, e.g. junction temperature, of the component or subassembly to be protected is obtained. The output power can then be reduced on the basis of the relatively accurate knowledge of the internal or junction temperature inside the component or semiconductor. Additionally, the information concerning the internal temperature or junction temperature can also be included in the ascertainment of power loss, insofar as it is relevant (e.g. RDSON in the case of a MOSFET). The same component can therefore be used to produce higher output powers with full dependency. From the converse perspective, cheaper components can be used for the same output power with this method.

In particular, the method essentially therefore contains 5 cornerstones:
1. Ascertainment of the power loss of the component or subassembly to be protected,
2. Ascertainment of the temperature increase using the calculated power loss and a thermal model,
3. Temperature measurement,
4. Ascertainment of the maximum permissible power loss or output power,
5. (If need be) reduction of the power loss or output power.

Since said method is used to derive the maximum permissible power loss or output power directly from the destruction mechanism, namely the overheating inside the component or semiconductor, the margin of uncertainty can be drastically reduced in comparison with conventional methods, or those cited above. From the point of view of a customer, the device therefore has more output power.

The invention can be applied to electronic subassemblies of all types. It is therefore possible for capacitors, inductances, relays, resistors, motors or possibly even whole assemblies to be protected against overload, with the maximum power being able to be provided for the application at the same time.

BRIEF DESCRIPTION OF THE DRAWINGS

Further features, effects and advantages of the invention will become apparent from the description of a preferred exemplary embodiment of the invention that follows and from the accompanying figures, in which, in a schematic outline.

DETAILED DESCRIPTION

Figure 1:
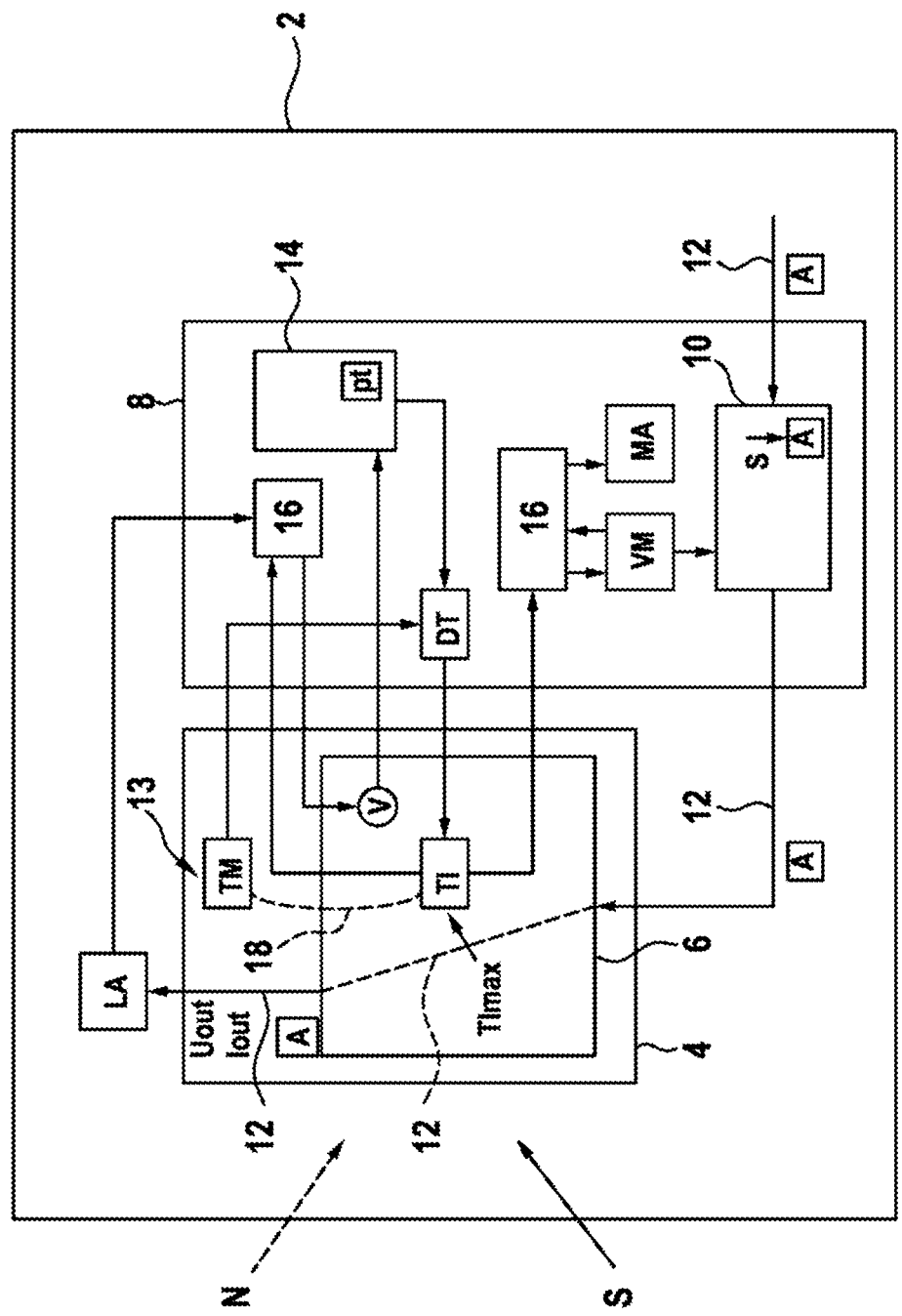
FIG. 1 shows an audio device according to the invention.

FIG. 1 shows an audio device 2. This contains an audio appliance 4. Inside, that is to say in its interior, the audio appliance 4 contains a component 6. The component 6 has inside, i.e. in its interior, an internal temperature TI that is not open to direct measurement. The component 6 needs to be protected against the exceeding of a maximum internal temperature, that is to say that the internal temperature TI is not supposed to exceed a maximum value. The audio device 2 additionally contains a protection module 8. This is configured to carry out a protection method. The protection method is explained later on.

The audio appliance 4 is an audio amplifier. The audio device 2 is therefore an amplifier device. The audio appliance 4 is an output stage. The component 6 is a semiconductor subassembly to be protected. The internal temperature TI is a junction temperature in the semiconductor subassembly. The protection module 8 contains an audio limiter 10. The audio limiter 10 is arranged in an audio path 12 upstream of the audio appliance 4. The audio limiter 10 is configured to limit an audio signal A which is supplied to the audio appliance 4 along the audio path 12 as an input signal, in an economy mode S, this being indicated by a downwardly directed arrow. The audio signal A is thus carried on the audio path 12. The protection module 8 performs the following protection method:

The method is used to protect the component 6 inside the audio appliance 4 against the exceeding of a maximum internal temperature TI. The method involves a power loss V of the component 6 being ascertained, said power loss being depicted symbolically by a circle in FIG. 1. Furthermore, at or outside the component 6, a measured temperature TM is measured at a measurement location 13, in this case at a heat sink, not depicted, thermally coupled to the component 6. A thermal model 14 of the component 6, which model is stored in the protection module 8, is used to ascertain a temperature difference DT for the component 6 from the power loss V. The temperature difference DT describes the difference produced by the internal temperature TI minus the measured temperature TM. The internal temperature TI is then ascertained as a sum of the measured temperature TM and the temperature difference DT to give TI=TM+DT. The internal temperature TI and known component data 16 of the component 6, which are likewise stored in the protection module 8, are used to ascertain a permissible maximum value VM for the power loss V. In the event of a power loss V equal to the maximum value VM, a maximum permitted or desired internal temperature TImax would be reached. In the present case, there is the threat of an overload, for which reason the audio signal 4 and hence the maximum output power LA are reduced in comparison with the normal mode N, as a result of which although the internal temperature TI reaches its maximum value TImax, it does not exceed it.

When the audio signal A is limited by an audio limiter 10, there is no "hard" distinction between normal mode N and economy mode S because the maximum output power LA is always limited. Only the value MA of the maximum output power LA is always reascertained on the basis of the present internal subassembly temperature TI and hence the limit value is also supplied to the audio limiter 10.

The aforementioned method steps are performed periodically. As such, an internal junction temperature TI is ascertained periodically as explained above. The component data 16 are used to periodically ascertain the maximum permissible power loss VM of the component 6 and, from this, the maximum permissible (value MA) output power LA. From this value MA, a limit value is prescribed for the audio limiter 10. If the expected power loss V as a result of the audio signal A upstream of the limiter 10 is thus below the maximum permissible power loss VM, then no kind of reduction is attempted. The component 6 is then operated in a normal mode N again (indicated in dashes in FIG. 1). In the example, the audio signal A is then thus supplied to the audio appliance 4 and hence to the component 6 in unlimited form on the audio path 12.

The power loss V is ascertained in the method by virtue of an output power LA of the component 6 being ascertained and the power loss V being ascertained on the basis of the output power LA and the known component data 16. In the example, the output power LA is the power of the audio signal A amplified by the component 6.

The ascertainment of the power loss V in this case also includes the currently ascertained internal temperature TI (after it has been ascertained for the first time or e.g. has been estimated the first time, e.g. equal to the measured temperature TM).

The component data 16 are used to ascertain a maximum value MA for the permissible output power LA of the component 6 from the maximum value VM for the permissible power loss V. In a reduced-power economy mode S, the component 6 is operated such that the output power LA has been limited or is limited to the maximum value MA.

The power loss V or output power LA is thus limited in the economy mode S by limiting the audio signal A using the audio limiter 10. The limiting of the output power LA also limits the power loss V, which is related thereto by means of the internal structure or properties of the component 6. In a normal mode N, no limiting by the audio limiter 10 is effected. The audio signal A can thus pass through the latter without alteration, so that the audio appliance is operated in regular fashion, i.e. without limitations.

Figure 2:
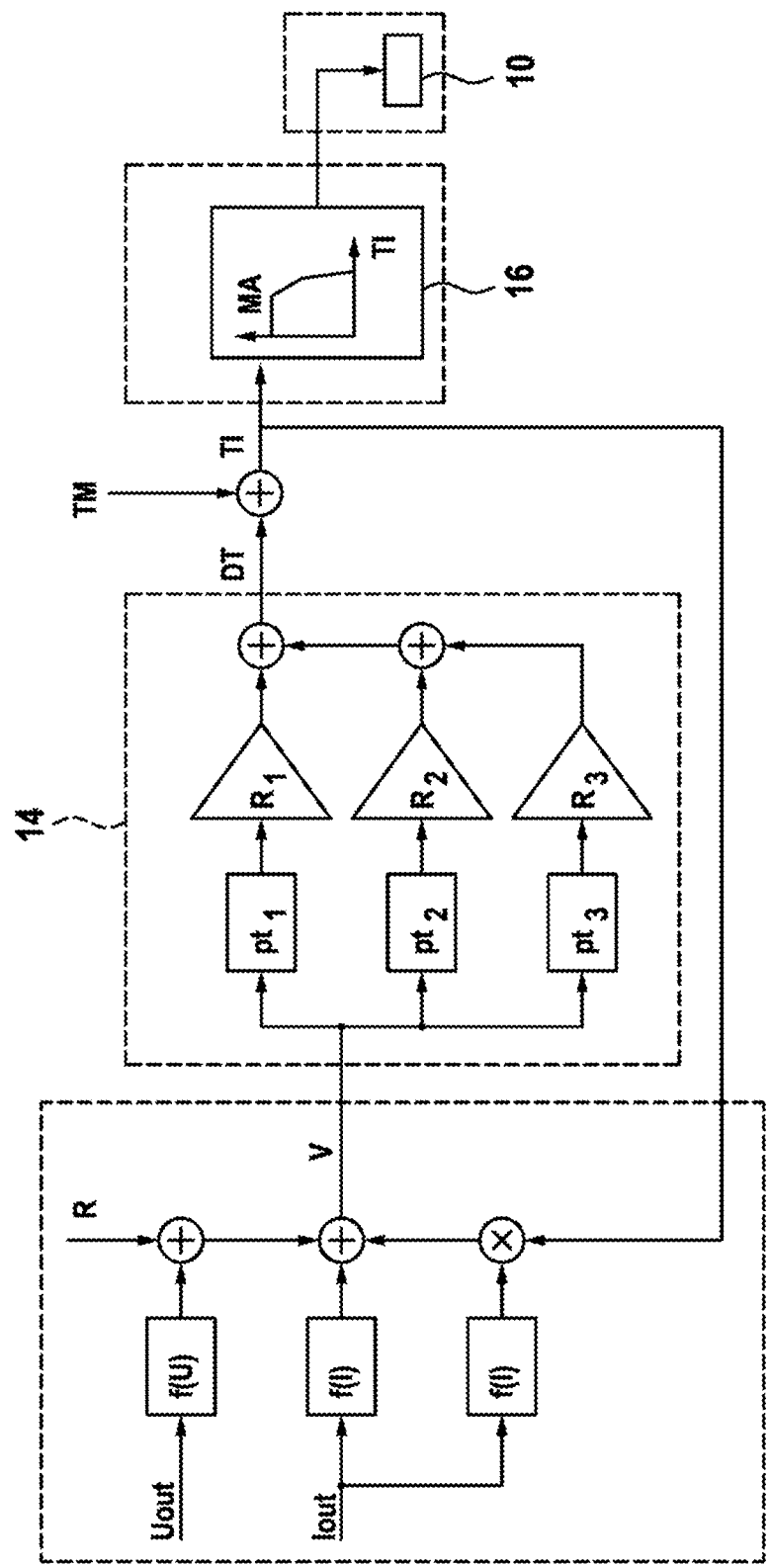
FIG. 2 shows a diagram to explain the method according to the invention.

FIG. 2 explains the invention specifically using the example of the semiconductor protection (protection of the component 6 in the form of a semiconductor) in the audio appliance 4 in the form of an audio power amplifier as shown in FIG. 1:

1. Ascertainment of the Power Loss (Indicated by a Dashed Frame)

An output voltage Uout and an output current Iout are measured at the component 6. Together with static parameters such as subassembly properties and internal operating voltages in the form of the component data 16, the output current Iout and output voltage Uout are taken as a basis for ascertaining the power loss V. The output voltage Uout and the output current Iout are modified in this case using functions f(U) and f(I) that are not explained more specifically, and the results are summed with an idle power loss R. Moreover, the subassembly temperature ascertained (e.g. estimated the first time as explained above) is also included in this case in the form of the internal temperature TI, since it also affects the power loss V produced by the output current Iout. In this case, the internal temperature TI is multiplied by and likewise summed with a function f(I), not explained more specifically, of the output current Iout. Therefore, the ascertained junction temperature (internal temperature TI) is fed back to the power loss ascertainment.

2. Thermal Model

The power loss V is used to calculate the heating in the form of the temperature difference DT using the thermal model 14. In this example, three time constants pt1-3 (with downstream thermal resistors R1-3, not explained more specifically) are used in order to describe the dynamic thermal behavior of a thermal section 18, i.e. the section from a junction in the component 6 (location of the internal temperature TI) to a temperature sensor, which is not depicted (measurement location 13 for the measurement of the measured temperature TM). In this case, the section 18 can be described sufficiently accurately using three time constants pt1-3. In other cases, more or fewer than three time constants pt can also be used in order to describe the dynamic thermal behavior of the section 18.

In the thermal model 14, 3 thermal time constants pt1-3 and three thermal resistors R1-3 are thus used, which describe a dynamic, thermal behavior of the thermal section 18 extending between the location of the internal temperature TI and the location of the measured temperature TM (measurement location 13).

3. Temperature Measurement

All in all, heating (temperature difference DT) and "ambient temperature" (measured temperature TM) result in the absolute junction temperature (internal temperature TI).

4. Ascertainment of the Maximum Permissible Output Power (Indicated by a Dashed Frame)

From a datasheet of the component 6 (component data 16), it is inferred at what internal temperature TI how much power loss (maximum value VM) can be asked of the subassembly (component 6). Since, of course, it is known (from the component data 16) how the influence of the output variables (output current Iout and output voltage Uout) affects the power loss V in the subassembly (component 6), it is also possible to work out the maximum permissible output variables (maximum values for Uout, Iout) from a permissible power loss VM of the subassembly.

5. Reduction of the Output Power (Indicated by a Dashed Frame)

The audio limiter 10 is used to limit the output power LA of the amplifier (audio appliance 4) such that the maximum permissible power loss VM in the semiconductor (component 6) is not exceeded. This is accomplished by transferring a threshold value, not explained more specifically, to the audio limiter 10.

The invention claimed is:

1. A method for protecting a component (6) inside an audio appliance (4) against the exceeding of a maximum internal temperature (TI), the method comprising:
   determining a power loss (V) of the component (6),
   measuring a measured temperature (TM) at the component (6),
   determining a temperature difference (DT) for the component (6) between the measured temperature (TM) at the component and the internal temperature (TI) from the power loss (V) using a thermal model (14) of the component (6),
   determining the internal temperature (TI) as the sum of the measured temperature (TM) and the temperature difference (DT),
   determining a permissible maximum value (VM) for the power loss (V) using the internal temperature (TM) and known component data (16) of the component (6),
   limiting an audio signal (A) such that the power loss (V) does not exceed the maximum value (VM) and the maximum internal temperature is not exceeded.

2. The method as claimed in claim 1, wherein the power loss (V) is determined by virtue of the output power (LA) of the component (6) being determined and the power loss (V) being determined on the basis of the output power (LA) and the known component data (16).

3. The method as claimed in claim 1, wherein the power loss (V) is also determined on the basis of the internal temperature (TI) and the measured temperature (TM).

4. The method as claimed in claim 1, wherein at least one thermal time constant (pt) describing a dynamic thermal behavior of a thermal section (18) between the location of the internal temperature (TI) and the measurement location (13) of the measured temperature (TM) is used in the thermal model (14).

5. The method as claimed in claim 1, wherein the component data (16) are used to determine a maximum value (MA) for a permissible output power (LA) of the component (6) from the maximum value (VM) for the permissible power loss (V), and the component (6) is operated in the reduced-power economy mode (S) such that the output power (LA) is limited to the associated maximum value (MA).

6. The method as claimed in claim 1, wherein, in the economy mode (S), the power loss (V) is limited to the maximum value (VM) using an audio limiter (10), arranged in an audio path (12) upstream of the component (6), by virtue of an audio signal (A) carried on the audio path (12) being limited as an input signal into the component (6).

7. An audio device (2) having an audio appliance (4) that has a component (6) inside to be protected against the exceeding of a maximum internal temperature (TI) and having a protection module (8) for carrying out the method that follows, for carrying out the method as claimed in claim 1 including
   determining a power loss (V) of the component (6),
   measuring a measured temperature (TM) at the component (6),
   determining a temperature difference (DT) for the component (6) between the measured temperature (TM) at the component and an internal temperature (TI) of the component (6) using a thermal model (14) of the component (6) from the determined power loss (V),
   determining the internal temperature (TI) as the sum of the temperature difference (DT) and the measured temperature (TM) that is measured,
   determining a permissible maximum value (VM) for the power loss (V) on the basis of the internal temperature (TM) and known component data (16) of the component (6),
   limiting an audio signal (A) such that the power loss (V) does not exceed a maximum value (VM) and/or the maximum internal temperature is not exceeded.

8. The audio device (2) as claimed in claim 7, characterized in that the audio appliance (4) and/or the audio device (2) is an audio amplifier.

9. The audio device (2) as claimed in claim 7, characterized in that the component (6) contains or is a semiconductor subassembly to be protected, and the internal temperature (TI) is a junction temperature in the semiconductor subassembly.

10. The audio device (2) as claimed in claim 7, characterized in that the protection module (8) contains an audio limiter (10) that is arranged in an audio path (12) upstream of the audio appliance (4) and that is configured to limit an audio signal (A) carried on the audio path (12) as an input signal into the audio appliance (4) in the economy mode (S).

11. The method as claimed in claim 1, wherein the power loss (V) is also determined on the basis of the internal temperature (TI).

12. The method as claimed in claim 1, wherein the power loss (V) is also determined on the basis of the measured temperature (TM).

13. The method as claimed in claim 1, wherein the internal temperature (TI) is an internal junction temperature.

14. The audio device (2) as claimed in claim 7, wherein the internal temperature (TI) is an internal junction temperature.

* * * * *